United States Patent
Huang et al.

(10) Patent No.: US 10,622,637 B1
(45) Date of Patent: Apr. 14, 2020

(54) COPPER FOIL WITH EXCELLENT ADHESION

(71) Applicant: CHANG CHUN PETROCHEMICAL CO., LTD., Taipei (TW)

(72) Inventors: Huei-Fang Huang, Taipei (TW);
Yao-Sheng Lai, Taipei (TW);
Jui-Chang Chou, Taipei (TW)

(73) Assignee: CHANG CHUN PETROCHEMICAL CO., LTD., Taipei (TW)

( * ) Notice: Subject to any disclaimer, the term of this patent is extended or adjusted under 35 U.S.C. 154(b) by 0 days.

(21) Appl. No.: 16/584,157

(22) Filed: Sep. 26, 2019

Related U.S. Application Data

(60) Provisional application No. 62/800,263, filed on Feb. 1, 2019.

(51) Int. Cl.
| | | |
|---|---|---|
| *H01M 4/66* | (2006.01) | |
| *C25D 1/04* | (2006.01) | |
| *H01M 4/70* | (2006.01) | |
| *H01M 10/0525* | (2010.01) | |

(52) U.S. Cl.
CPC .............. *H01M 4/661* (2013.01); *C25D 1/04* (2013.01); *H01M 4/70* (2013.01); *H01M 10/0525* (2013.01)

(58) Field of Classification Search
None
See application file for complete search history.

(56) References Cited

U.S. PATENT DOCUMENTS

| | | | |
|---|---|---|---|
| 9,899,683 B2 * | 2/2018 | Lee | H01M 4/661 |
| 10,205,170 B1 * | 2/2019 | Huang | H01M 4/38 |
| 2004/0029006 A1 | 2/2004 | Otsuka et al. | |
| 2012/0111733 A1 * | 5/2012 | Tsai | C25C 1/12 205/350 |
| 2014/0264417 A1 | 9/2014 | Kobayashi | |
| 2017/0320247 A1 | 11/2017 | Aizawa | |
| 2018/0245230 A1 | 8/2018 | Sonoda | |
| 2018/0282890 A1 * | 10/2018 | Chun | C25D 1/08 |
| 2019/0145014 A1 | 5/2019 | Chen | |
| 2019/0249322 A1 | 8/2019 | Lee | |

OTHER PUBLICATIONS

Belov et al. (Correlation between 3D Texture of Steel Substrate and Tin-Coated Surface with Various Coating Masses, ISSN: 1662-9795, vol. 769, pp. 120-127, doi:10.4028/www.scientific.net/KEM.769.120, © 2018 Trans Tech Publications Ltd, Switzerland), (Year : 2018).
Huang et al. Pulsed Deposition of Ultra-thin Copper Foils, Plating & Surface Finishing, Sep. 2004, pp. 34-38.

* cited by examiner

*Primary Examiner* — Jonathan Crepeau
(74) *Attorney, Agent, or Firm* — Nixon Peabody LLP; Thomas P. Pavelko

(57) ABSTRACT

Electrodeposited copper foils having properties suitable for use as current collectors in lithium-ion secondary batteries are disclosed. The electrodeposited copper foils include a drum side and a deposited side. At least one of the deposited side or the drum side exhibits a void volume (Vv) value in the range of 0.17 to 1.17 $\mu m^3/\mu m^2$.

16 Claims, 1 Drawing Sheet

COPPER FOIL WITH EXCELLENT ADHESION

CROSS REFERENCE TO RELATED APPLICATIONS

This application claims the benefit under 35 U.S. C. § 119(e) of U.S. Provisional Application No. 62/800,263 filed Feb. 1, 2019, the contents of which are incorporated herein by reference in their entirety.

FIELD OF THE INVENTION

The present disclosure relates to electrodeposited copper foils having high durability and workability. The disclosure also relates to lithium ion secondary batteries incorporating said electrodeposited copper foils as a component thereof.

BACKGROUND

Lithium-ion secondary batteries have a combination of high energy and high power density, making it the technology of choice for portable electronic devices, power tools, electric vehicles ("EVs"), energy storage systems ("ESS"), cell phones, tablets, space applications, military applications, and railways. Electric vehicles (EVs), include hybrid electric vehicles ("HEVs"), plug-in hybrid electric vehicles ("PHEVs"), and pure battery electric vehicles ("BEVs"). If electric vehicles (EVs) replace the majority of fossil fuel (e.g., gasoline, diesel fuel, etc.) powered transportation, lithium-ion secondary batteries will significantly reduce greenhouse gas emissions. The high energy efficiency of lithium-ion secondary batteries may also allow their use in various electric grid applications, including improving the quality of energy harvested from wind, solar, geo-thermal and other renewable sources, thus contributing to their more widespread use in building an energy-sustainable economy.

Therefore, lithium-ion secondary batteries are of intense interest for commercial ventures as well as in basic research in government and academic laboratories. Although research and development in this field has abounded in recent years and lithium-ion secondary batteries are currently in use, there remains a need for improvements with respect to higher capacity, higher current generation, and batteries that can undergo more charge/discharge cycles thereby extending their useful life. Additionally, improvements in the weight of the batteries are needed to improve applications in several environments, such as vehicle, portable electronics and space applications.

Lithium-ion secondary batteries typically include a current collector of a metal foil on which is deposited with an active material. Copper foils are often used as the current collector because copper is a good conductor of electrical current. As demands for lower weight batteries become ever more urgent, the current collector needs to be thinner to reduce the size and weight of lithium-ion secondary battery. Additionally, to increase the capacity of the lithium-ion secondary battery, materials such as silicon (Si), germanium (Ge), and tin (Sn) are mixed with or fill the higher capacity active material in a battery, exacerbating the expansion and contraction of the active material and stresses on the copper foil it is in contact with. Furthermore, in some recent advancements, in order to increase the capacity of the batteries, the copper foils, worked as electrodes, are folded or bent and wound. If the copper foil cannot withstand the expansion and contraction of the active material during battery use, or cannot withstand folding and winding during production of the battery, the cycle characteristics of the battery are adversely affected.

There therefore remains a need for improved copper foils for use in lithium-ion secondary batteries. There is also a need for thinner copper foils having improved workability and durability and that, when combined with the active materials to provide lithium-ion secondary batteries, do not fail under high cycles of charge and discharge due to separation between the copper foil and the active materials, or fail due to the copper foil fracturing. All the while, these needed thinner copper foils, fulfilling the goals of reducing the weight and increasing the capacity of lithium-ion secondary batteries, must not fail during either the production of the battery, or in use of the battery.

SUMMARY

In general, the disclosure described herein relates to a copper foil such as an electrodeposited copper foil that can be used as a current collector in lithium-ion secondary batteries. For example, electrodeposited copper foils have been prepared having controlled properties such as the void volumes.

In a first aspect, the disclosure comprises an electrodeposited copper foil comprising a drum side and a deposited side opposing the drum side, wherein at least one of the drum side and the deposited side exhibits a void volume (Vv) value in the range of 0.17 to 1.17 $\mu m^3/\mu m^2$. Optionally the drum side and the deposited side each exhibits a void volume (Vv) value in the range of 0.17 to 1.17 $1\mu m^3/\mu m^2$. Optionally, at least one of the drum side and the deposited side further exhibits a core void volume (Vvc) value in the range of 0.16 to 1.07 $1\mu m^3/\mu m^2$. Optionally the drum side and the deposited side each further exhibits a core void volume (Vvc) value in the range of 0.16 to 1.07 $1\mu m^3/\mu m^2$. Optionally at least one of the drum side and the deposited side further exhibits a dale void volume (Vvv) value in the range of 0.01 to 0.10 $\mu m^3/\mu m^2$. Optionally the drum side and the deposited side each further exhibits a dale void volume (Vvv) value in the range of 0.01 to 0.10 $1\mu m^3/\mu m^2$. Optionally, a surface of the copper foil comprises at least one coating selected from the group consisting of a zinc-chromium coating, chromium coating, and an organic coating. Optionally a surface of the copper foil comprises a chromium plating.

Some additional properties according to the first aspect of the disclosure include the following. Optionally the electrodeposited copper foil further exhibits a fatigue life/thickness of more than 5 $\mu m^{-1}$. Optionally the fatigue life/thickness is in the range of 8 to 40 $\mu m^{-1}$. Optionally the electrodeposited copper foil has a thickness in the range of 2 $\mu m$ to 25 $\mu m$.

In a second aspect, the disclosure comprises a current collector for a lithium-ion secondary battery comprising an electrodeposited copper foil, for example, the electrodeposited copper foil as describe in the first aspect of the invention. Optionally the current collector further comprises an anode active material in contact with the deposited side of the electrodeposited copper foil. Optionally the current collector further comprises an anode active material in contact with the drum side of the electrodeposited copper foil.

In a third aspect, the disclosure comprises a lithium-ion battery comprising the current collector, for example, as describe in the second aspect of the invention.

The electrodeposited copper foils as described herein show excellent properties, for example, when used in lithium-ion secondary batteries. In addition to allowing the fabrication of light secondary batteries with high capacity, batteries made with these electrodeposited copper foils have excellent charge-discharge cycling properties. For example, the copper foils and the active materials do not separate or fracture during high amounts of charge-discharge cycling for the lithium-ion secondary battery. Without being bound to a specific mechanism, it is suggested that at least part of these improvements are due to the excellent adhesion between the copper foil and the active material, as well as having reduced number of breaking/failure points in the copper foil.

The above summary is not intended to represent every embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings.

Figure 1:
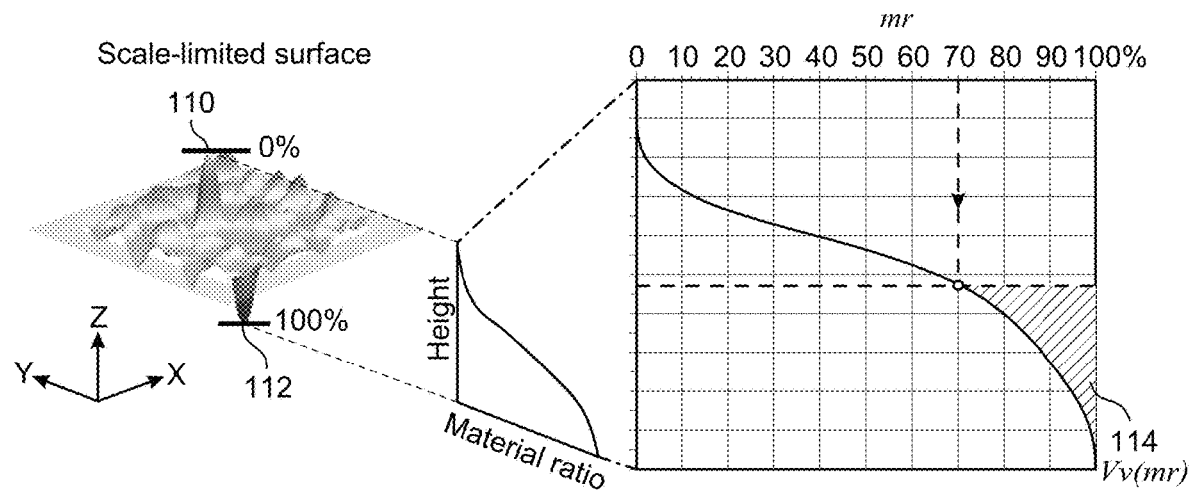
FIG. 1 shows a 3D surface plot and an areal material ratio plot.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

It should be expressly understood that all the graphics and other representations of the drawings are schematic only. The same numbers are used to represent similar elements in various figures of the drawings to facilitate understanding of the disclosed embodiments.

DETAILED DESCRIPTION

Articles of manufacture herein relate to electrodeposited copper foils that have quantifiable characteristics and which provide good performance when used as current collectors. For example, these electrodeposited copper foils can be combined with active materials to provide anodes for lithium-ion secondary batteries. Some embodiments of the electrodeposited copper foil feature void volume in the copper foils modulated to specific amounts.

As used herein the "drum side" of the copper foil is the surface of the copper foil that is in contact with a drum used during the electrodeposition, while the "deposited side" is the opposite side, or the surface of the electrodeposited copper foil that is in contact with an electrolyte solution during the electrodeposition forming the copper foil. These terms relate to a manufacturing process for producing electrodeposited copper foils which include partially immersing a rotating drum assembly into an electrolyte solution containing copper ions, and optionally other additives such as rare earth metals and surfactants. Therefore, under operation of an electric current, copper ions are drawn to the drum and reduced, resulting in copper metal plating onto the surface of the drum forming an electrodeposited copper foil on the surface of the drum. This electrodeposited copper foil is formed and removed from the drum in a continuous process by rotating the drum and removing the electrodeposited copper foil as the formed copper foil rotates with the drum out of the electrolyte solution. For example, the electrodeposited copper foil can be pulled off the drum as it is formed by, and passed over or through rollers in a continuous process.

The electrodeposited copper foil has surface texture or features that affect its properties and final performance when incorporated into a battery. One such feature is the void volume parameters, which are described with reference to FIG. 1 which shows a 3D surface, such as a drum side or a deposited side of an electrodeposited copper foil, and the derivation of the areal material plot for obtaining void volume parameters. FIG. 1, left side, is a three-dimensional graphic representation of the surface geometry of the surface. FIG. 1, right side shows the derivation of an areal material ratio curve as can be obtained by using the ISO Standard Method ISO 25178-2:2012, which spans a material ratio (mr) of 0%, at the top of the highest peak 110, to the lowest valley or hole 112 at which the mr is 100%. The void volume (Vv) is calculated by integrating the volume of the voids enclosed above the surface and below a horizontal cutting plane set at a height corresponding to a specified material ratio (mr) between 0% (the top of the peak 110) and 100% (the bottom of the hole 112). For example, the Vv at 70% mr is shown as the shaded area 114 on the right side plot of FIG. 1. As used herein, the Vv's listed are the Vv at 10% material ratio unless otherwise noted.

Figure 2:
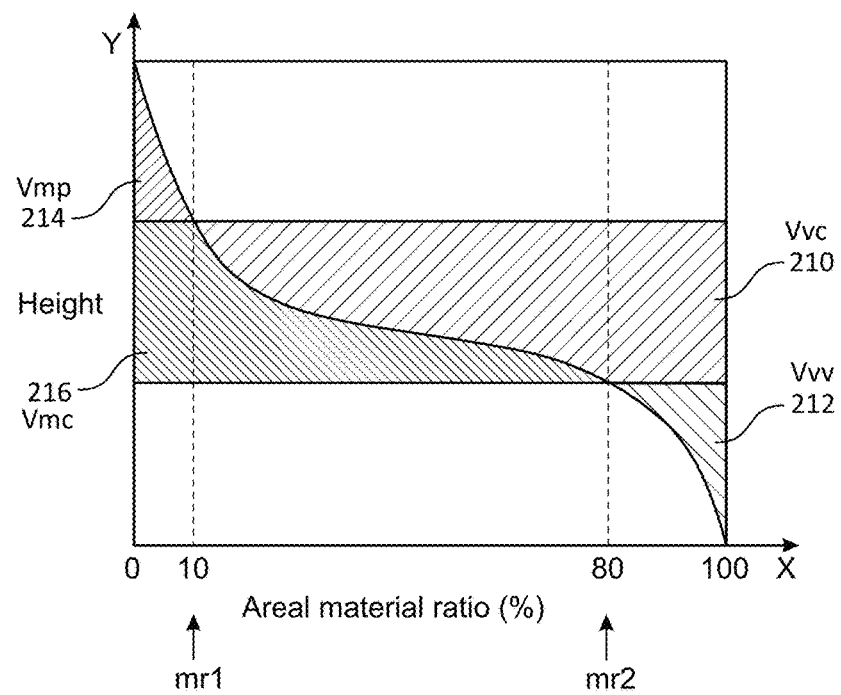
FIG. 2 shows details of an areal material ratio plot.

FIG. 2 shows more details of an areal material ratio plot with some relationship regarding different kinds of void volume parameters defined. The core void volume (Vvc) is the difference in void volume between two material ratios, such as mr1 and mr2, shown as area 210. For example, as used herein unless otherwise specified Vvc is chosen to be chosen where mr1 is 10% and mr2 is 80%. The dale void volume (Vvv), which is also called valley void volume, is the void volume at a specified mr value, such as mr at 80%, shown as area 212. As used herein, unless otherwise specified, Vvv is calculated at a material ratio of 80%. The void volume (Vv) at mr1 is the sum of the core void volume (Vvc) between mr1 and mr2, area 210, and the dale void volume (Vvv), area 212, at mr2. Other regions include the peak material volume (Vmp), area 214, and the core material volume (Vmc), area 216.

In some embodiments, the electrodeposited copper foil has a Vv, in a controlled range between a low and a high value, such as between a low value of about 0.17 ($\mu m^3/\mu m^2$) and a high value of about 1.17 ($\mu m^3/\mu m^2$). When Vv is too low, such as less than about 0.17 ($\mu m^3/\mu m^2$), the adhesion of the copper foil to the active material is poor due to weak anchor effect. That is, the material cannot anchor to the surface very well so adherence is poor. Conversely, if Vv is too high, such as above about 1.17 ($\mu m^3/\mu m^2$), the active material does not coat uniformly on the surface of the electrodeposited copper foil. That is, a large Vv corresponds to large voids on the surface of the copper foil and the active material cannot effectively fill all of these voids, leaving some uncovered and covered voids that remain between the copper foil and the active material layer. Consequently, both in the too low region and too high region, the adhesion of the active material to the electrodeposited copper foil is poor, and batteries made with copper foils not having Vv in the controlled range can exhibit poor battery characteristics.

A Vv value in the range of 0.17 to 1.17 ($\mu m^3/\mu m^2$) is described for at least one of the deposited side or the drum side of the electrodeposited copper foil, and which is independently selected between the deposited side and the drum side. It is to be expressly understood that these ranges are continuous and could be represented as: 0.17, 0.18, 0.19, 0.20, 0.21, 0.22, 0.23, 0.24, 0.25, 0.26, 0.27. 0.28, 0.29, 0.30, 0.21, 0.22, 0.23, 0.24, 0.25, 0.26, 0.27. 0.28, 0.29, 0.30, 0.31, 0.32, 0.33, 0.34, 0.35, 0.36, 0.37. 0.38, 0.39, 0.40, 0.41, 0.42, 0.43, 0.44, 0.45, 0.46, 0.47. 0.48, 0.49, 0.50, 0.51, 0.52, 0.53, 0.54, 0.55, 0.56, 0.57. 0.58, 0.59, 0.60, 0.61, 0.62, 0.63, 0.64, 0.65, 0.66, 0.67. 0.68, 0.69, 0.70, 0.71, 0.72, 0.73, 0.74, 0.75, 0.76, 0.77. 0.78, 0.79, 0.80, 0.81, 0.82, 0.83, 0.84, 0.85, 0.86, 0.87. 0.88, 0.89, 0.90, 0.91, 0.92, 0.93, 0.94, 0.95, 0.96, 0.97. 0.98, 0.99, 1.01, 1.02, 1.03, 1.04, 1.05, 1.06, 1.07, 1.08, 1.09, 1.10, 1.11, 1.12, 1.13, 1.14, 1.15, 1.16, and 1.17 ($\mu m^3/\mu m^2$), with each of these values representing an endpoint in a range of values. In some embodiments, a core void volume (Vvc) value on at least one of the deposited side or drum side of the electrodeposited copper foil lies in the range of 0.16 to 1.07 ($\mu m^3/\mu m^2$), and as described for Vv these ranges are continuous and can be represented by any range or values between these 0.16 and 1.07 ($\mu m^3/\mu m^2$). In some embodiments, the electrodeposited copper foil exhibits a dale void volume (Vvv) value on at least one of the deposited or drum side in the range of 0.01 to 0.10 ($\mu m^3/\mu m^2$), and as described for Vv and Vvc these ranges are continuous and can be represented by any range or values between these 0.01 and 0.10 ($\mu m^3/\mu m^2$).

As used herein "fatigue life" is a quantitative measurement relating to the bending characteristics of an electrodeposited copper foil, and a fatigue life test is described in detail below. The bending properties of the copper foil can influence the adhesion of active materials, such as conductive carbon materials, to the copper foil and therefore can influence a battery's performance. In some embodiments, the copper foil has a high fatigue life, such as a fatigue life/thickness greater than 5 $\mu m^{-1}$ (e.g., greater than 8, 10, 20 or 30 $\mu m^{-1}$). Low fatigue life can produce an electrodeposited copper foil that is more susceptible to failure, such as fracture, during the charge-discharge cycle test.

In some embodiments, the electrodeposited copper foil can be used to form a battery. For example, a laminated type lithium-ion battery or a coin-type lithium ion battery. Therefore, in some embodiments, the electrode made using the copper foil can be formed as a cathode, and the active material coated thereon is a cathode active material. In some other embodiments, the electrode made using the copper foil can be formed as an anode, and the active material coated thereon is an anode active material.

In some embodiments, the electrodeposited copper foil includes an anti-tarnish coating formed on its surfaces which can protect the electrodeposited copper foil from degradation such as due to corrosion. This can be made by any known method and includes dipping or passing the formed electrodeposited copper foil through a solution containing anti-tarnish forming additives, or plating (e.g., electroplating) a metal or alloy film on the formed electrodeposited sheet. For example, a bath including any one or more of zinc, chromium, nickel, cobalt, molybdenum, vanadium and combinations thereof; or an organic compound that forms an anti-tarnish resistant layer. The processing can be continuous and part of the overall process in preparing the electrodeposited copper foil.

As used herein, charge-discharge testing refers to testing where a potential is applied across the positive and negative electrodes of a battery so as to charge the battery, and then connecting the positive and negative electrodes across a load and allowing the current to pass through the load to discharge the battery. This charge and discharge represents one charge-discharge cycle. The testing can be done to simulate how well a battery performs with respect to repeated use. The "cycle-life" or "charge-discharge cycle life" is defined as the number of charge-discharge cycles a battery can perform before its nominal capacity falls below 80% of its initial rated capacity.

In some embodiments, the electrodeposited copper foils can be used as current collectors for batteries (e.g., lithium-ion secondary batteries) and are used in a device. As used herein a device comprises any item or component requiring electric power for its operation. For example, self-contained, isolated and mobile components and devices requiring small and light batteries. Without limitation, these can include vehicles (automobiles, street cars, buses, trucks, boats, submarines, airplanes), computers (e.g., for microcontrollers, laptops, tablets), phones (e.g., smart phones, wireless landlines), personal health monitoring and sustaining equipment (e.g., glucose monitors, pacemakers), tools (e.g., electric drills, electric saws), illuminators (e.g., flashlights, emergency lighting, signs), hand held measuring devices (e.g., pH meters, air monitoring devices) and habitation units (e.g., in a spaceship, in a trailer, in a house, in a plane, in a submarine).

It should be understood within the scope of the present disclosure, the above-mentioned technical features and technical features mentioned below (such as examples) can be combined freely and mutually to form new or preferred technical solutions, which are omitted for brevity.

EXAMPLES

Electrodeposited Copper Foil Preparation

Electrodeposited copper foils were prepared using a rotatable metal cathode drum and an insoluble metal anode. The insoluble metal anode is arranged at approximately the lower half of the metal cathode drum and surrounds the metal cathode drum. The electrodeposited copper foils were manufactured using continuous electrodeposition by flowing a copper sulfate electrolyte solution between the metal cathode drum and the insoluble metal anode, applying an electrical current between these causing electrodeposition of copper on the metal cathode drum and thereby forming the electrodeposited copper foil.

In some experiments, as indicated in Table 2 below, the anode was covered with an anode bag (BEIP308W10L20, manufactured by Taiwan Grace International Corp) during the formation of the electrodeposition to prepare the electrodeposited copper foil. The anode bag encloses the anode but is open at the top, outside of the electrolyte solution. This allowed oxygen bubble to flow out of the electrolyte solution and away from the anode.

After the bare electrodeposited copper foil was produced, the copper foil was pulled from the drum and the surfaces of the electrodeposited copper foil were treated with an anti-tarnish material in a continuous fashion by guide rollers passing the electrodeposited copper foil through a plating bath.

The composition of the electrolyte solution and plating conditions were provided as below.

Electrolyte Solution
Sulfuric acid (50 wt %): 75 g/L
Copper sulfate (CuSO$_4$.5H$_2$O): 280 g/L
Chloride ion concentration: 15 mg/L (from hydrochloric acid, available from RCI Labscan Ltd.)
Cerium sulfate (Ce(SO$_4$)$_2$): 0-55 mg/L (available from Sigma-Aldrich)
Liquid temperature: 40° C.
Current density: 33-65 A/dm$^2$ Anti-Tarnish Treatment
CrO$_3$: 1500 mg/L (available from Sigma-Aldrich)
Liquid temperature: 25° C.
Current density: 0.5 A/dm$^2$
Plating time: 1 second Laminated Lithium-Ion Secondary Battery Laminated type lithium-ion secondary batteries were prepared as follows and subjected to high c-rate charging/discharging testing.

A cathode slurry and an anode slurry were made using N-methyl-2-pyrrolidone (NMP) as a solvent. The cathode slurry was formulated to have a liquid to solid ratio of 195 wt % (195 g of NMP:100 g of the cathode active material). The anode slurry was made to have a liquid to solid ratio of 60 wt % (60 g of NMP:100 g of the anode active material). Formulations of the cathode active material and the anode active material are shown in Table 1.

The cathode slurry was coated on an aluminum foil, and the anode slurry was coated on the electrodeposited copper foil. After the solvent evaporated, the anode and cathode were pressed and cut into the desired dimensions. The cathodes and anodes are alternately stacked with separators (Celgard Company) sandwiched there between, and placed in a container molded by laminate film. The container was filled with an electrolyte, and sealed to form a battery. The size of the laminated type battery was 41 mm×34 mm×53 mm.

For high c-rate charging and discharging testing (e.g., charge-discharge testing), the charging mode was a constant current-constant voltage (CCCV) mode, where the charging voltage was 4.2V, and the charging current was 5 C. The discharging mode was the constant current (CC) mode, the discharging voltage was 2.8 V, and the discharging current was 5 C. The charging-discharging test on the batteries was conducted at high temperature (at 55° C.).

Electrodeposited Copper Foils Examples.

Table 2 shows a designed experiment exemplifying embodiments of electrodeposited copper foils. In the column of anode bag, X represents the absence of anode bag and O represents the presence of anode bag. Table 3 shows the resultant properties or features of the electrodeposited copper foil. In the column of Vv, Δ represents the difference (absolute value) in Vv between the deposited and drum side. The wet adhesion is of an anode prepared as described below in the "wet adhesion test. The rows list seven experimental runs (E.1 through E.7) and five control experiments (C.1 through C.5).

This data, inter alia, shows that when void volumes (Vv) of the copper foils are in a range between about 0.17 to 1.17 μm$^3$/μm$^2$ for at least one side of the electrodeposited copper foil, these exhibit high fatigue life, have a strong wet adhesion and the cycle life of batteries made with these copper foils is high. When void volumes (Vv) of the copper foils are not in these ranges, the properties of fatigue life, adhesion and cycle life are inferior. For example, fatigue life/thickness is less than about 8, wet adhesion testing fails and cycle life is less than about 800.

TABLE 1

Active Material Formulation

Cathode active material formulation: Based on the total weight of the cathode active material

| | |
|---|---|
| Cathode active substance (LiCoO2) | 89 wt % |
| Conductive additive (Flaked graphite; KS6) | 5 wt % |
| Conductive additive (Conductive carbon powder; Super P ®) | 1 wt % |
| Solvent-Based Binder (PVDF1300) | 5 wt % |

Anode active material formulation: Based on the total weight of the anode active material

| | |
|---|---|
| Anode active substance: Mesophase Graphite Powder (MGPA) | 93.9 wt % |
| Conductive additive (Conductive carbon powder; Super P ®) | 1 wt % |
| Solvent-Based Binder (PVDF6020) | 5 wt % |
| Oxalic acid | 0.1 wt % |

TABLE 2

| | Anode Bag[1] | Cerium sulfate (ppm) | Current density (A/dm$^2$) | Area weight (g/m$^2$) | Thickness (μm) |
|---|---|---|---|---|---|
| E.1 | O | 45 | 33 | 53.5 | 6 |
| E.2 | X | 15 | 33 | 53.5 | 6 |
| E.3 | X | 45 | 33 | 53.5 | 6 |
| E.4 | O | 55 | 65 | 53.5 | 6 |
| E.5 | O | 0 | 33 | 53.5 | 6 |
| E.6 | O | 45 | 33 | 25.4 | 2.9 |
| E.7 | O | 45 | 33 | 187.1 | 21 |
| C.1 | X | 0 | 33 | 53.5 | 6 |
| C.2 | X | 5 | 33 | 53.5 | 6 |
| C.3 | X | 55 | 33 | 53.5 | 6 |
| C.4 | O | 55 | 33 | 53.5 | 6 |
| C.5 | X | 55 | 65 | 53.5 | 6 |

[1]O indicates anode bag is used; X indicates anode bag is not used

| | Vvc [μm$^3$/μm$^2$] | | Vvv [μm$^3$/μm$^2$] | | Vv [μm$^3$/μm$^2$] | | | Fatigue Life/ | | | Charge- |
|---|---|---|---|---|---|---|---|---|---|---|---|
| | Drum side | Deposited side | Drum side | Deposited side | Drum side | Deposited side | Δ | Fatigue Life | Thickness (μm$^{-1}$) | Wet Adhesion | discharge Cycle Life |
| E.1 | 0.16 | 0.18 | 0.01 | 0.02 | 0.17 | 0.20 | 0.03 | 243 | 40 | Pass | 1330 |
| E.2 | 1.07 | 1.05 | 0.10 | 0.09 | 1.17 | 1.14 | 0.03 | 51 | 8 | Pass | 819 |
| E.3 | 0.65 | 0.68 | 0.07 | 0.07 | 0.72 | 0.75 | 0.03 | 157 | 26 | Pass | 1247 |
| E.4 | 0.29 | 0.92 | 0.04 | 0.10 | 0.33 | 1.02 | 0.69 | 163 | 27 | Pass | 953 |
| E.5 | 0.23 | 0.22 | 0.05 | 0.03 | 0.28 | 0.25 | 0.03 | 188 | 31 | Pass | 1352 |

| | Vvc [μm³/μm²] | | Vvv [μm³/μm²] | | Vv [μm³/μm²] | | | Fatigue Life/ | | | Charge-discharge Cycle Life |
|---|---|---|---|---|---|---|---|---|---|---|---|
| | Drum side | Deposited side | Drum side | Deposited side | Drum side | Deposited side | Δ | Fatigue Life | Thickness (μm⁻¹) | Wet Adhesion | |
| E.6 | 0.17 | 0.17 | 0.01 | 0.04 | 0.18 | 0.21 | 0.03 | 109 | 38 | Pass | 1342 |
| E.7 | 0.17 | 0.16 | 0.02 | 0.03 | 0.19 | 0.19 | 0.00 | 789 | 38 | Pass | 1325 |
| C.1 | 1.29 | 1.31 | 0.15 | 0.16 | 1.44 | 1.47 | 0.03 | 29 | 5 | Fail | 695 |
| C.2 | 1.29 | 1.29 | 0.21 | 0.23 | 1.50 | 1.52 | 0.02 | 15 | 2 | Fail | 702 |
| C.3 | 0.05 | 0.04 | 0.01 | 0.01 | 0.06 | 0.05 | 0.01 | 12 | 2 | Fail | 647 |
| C.4 | 0.03 | 0.02 | 0.01 | 0.01 | 0.04 | 0.03 | 0.01 | 145 | 24 | Fail | 685 |
| C.5 | 0.38 | 1.21 | 0.05 | 0.12 | 0.43 | 1.33 | 0.90 | 10 | 2 | Fail | 694 |

Test Methods

Volume Parameters

The void volume (Vv) values in Table 3 were obtained from the examples and comparative examples by a procedure in accordance with ISO 25178-2 (2012). Surface texture analysis was performed of images of a laser microscope. The laser microscope was a LEXT OLS5000-SAF manufactured by Olympus and the images were made at an air temperature of 24±3° C. and a relative humidity of 63±3%. The filter setting was set to unfiltered. The light source was a 405 nm-wavelength source. The objective lenses were 100× magnification (MPLAPON-100xLEXT). The optical zoom was set to 1.0×. The image area was set to 129 μm×129 μm. The resolution was set to 1024 pixels×1024 pixels. The condition was set to auto tilt removal.

The Vvc was calculated with the material ratios of p and q where p is 10% and q is 80%, Vvv was calculated with a material ratio of 80%. The unit of the void volume is μm³/μm², and Vv was calculated with material ratio of 10%.

Area Weight and Thickness

The area weight is a weight per unit area. Test specimens having 100 mm×100 mm were used to determine the area. The weight was determined by a micro balance (AG-204, Mettler Toledo International Inc.), and the area weight is calculated through dividing the weight with area and converting to gram/meter squared (g/m³).

Thickness of the electrodeposited copper foil is measured by using Test Method 2.4.18 of IPC-TM-650. The following formula was used:

Thickness=$M/(A\rho)$: where the thickness is in micro meters (μm), M is the weight of the sample in grams (g), A is the area of the sample in square meters (m²), and p is the sample density. The density used for the electrodeposited copper foil used is 8.909 g/cm³.

Wet Adhesion Test

An anode was prepared by coating the anode slurry on the surface of copper foil at a speed of 5 m/min to a thickness of 200 μm and drying through a 160° C. oven. The anode was then pressed by using a pressing machine at a pressing speed of 1 m/min and a pressure of 3000 psi. The dimension of the rollers of the pressing machine was φ250 mm×width 250 mm, hardness of the rollers was 62~65° HRC, and the material of the roller was high-carbon chrome bearing steel (SUJ2). The anode was then cut into a 10 cm×10 cm piece as a test piece and immersed in the electrolyte (LBC322-01H, manufactured by Shenzhen Capchem Technology Co., Ltd.). If the anode slurry was delaminated from the copper foil or swollen between the copper foil, it was considered as fail. In the contrary, if there was no delamination or swollen, it was considered as pass.

Fatigue Life

Fatigue life was tested using Standard Test Method IPC-TM-650 2.4.2.1. Briefly the method includes attaching a test specimen which is in the form of a thin strip (e.g., of the electrodeposited copper foil) to a holder that is hanged with a weight, and then the center of the test specimen is rapidly vibrated up and down by using a mandrel with a set diameter. Tests were done using a Model 3FDF Fatigue Ductility Tester (Jovil Universal Manufacturing Company). The test specimens were 12.7 mm×200 mm strips of the electrodeposited copper foil. The test conditions were as follows: diameter of mandrel=0.8 mm, vibration speed=100 vibrations/min, weight for providing tension=84.6 g. For testing, the specimen was attached to the sample holder with adhesive tape so that the sample did not slip from the sample holder. In addition, for the sampling direction, each specimen was cut so that its longer dimension (200 mm) was parallel to the machine direction.

As used herein the term "comprising" or "comprises" is used in reference to compositions, methods, and respective component(s) thereof, that are essential to the claimed invention, yet open to the inclusion of unspecified elements, whether essential or not.

As used herein the term "consisting essentially of" refers to those elements required for a given embodiment. The term permits the presence of elements that do not materially affect the basic and novel or functional characteristic(s) of that embodiment of the claimed invention.

The term "consisting of" refers to compositions, methods, and respective components thereof as described herein, which are exclusive of any element not recited in that description of the embodiment.

As used in this specification and the appended claims, the singular forms "a," "an," and "the" include plural references unless the context clearly dictates otherwise. Thus for example, references to "the method" includes one or more methods, and/or steps of the type described herein and/or which will become apparent to those persons skilled in the art upon reading this disclosure and so forth. Similarly, the word "or" is intended to include "and" unless the context clearly indicates otherwise.

Other than in the operating examples, or where otherwise indicated, all numbers expressing quantities of ingredients or reaction conditions used herein should be understood as modified in all instances by the term "about." The term "about" when may mean±5% (e.g., ±4%, ±3%, ±2%, ±1%) of the value being referred to.

Where a range of values is provided, each numerical value between and including the upper and lower limits of the range is contemplated as disclosed herein.

Unless otherwise defined herein, scientific and technical terms used in connection with the present application shall have the meanings that are commonly understood by those of ordinary skill in the art. Further, unless otherwise required by context, singular terms shall include pluralities and plural terms shall include the singular.

It should be understood that this invention is not limited to the particular methodology, protocols, and reagents, etc., described herein and as such may vary. The terminology used herein is for the purpose of describing particular embodiments only, and is not intended to limit the scope of the present invention, which is defined solely by the claims.

Any patents, patent applications, and publications including ASTM, JIS methods identified that are disclosed herein are expressly incorporated herein by reference for the purpose of describing and disclosing, for example, the methodologies described in such publications that can be used in connection with the present invention. These publications are provided solely for their disclosure prior to the filing date of the present application. Nothing in this regard should be construed as an admission that the inventors are not entitled to antedate such disclosure by virtue of prior invention or for any other reason. All statements as to the date or representation as to the contents of these documents is based on the information available to the applicants and does not constitute any admission as to the correctness of the dates or contents of these documents.

We claim:

1. An electrodeposited copper foil comprising:
a drum side and a deposited side opposing to the drum side, wherein at least one of the drum side and the deposited side exhibits a void volume (Vv) value in the range of 0.17 to 1.17 $\mu m^3/\mu m^2$.

2. The electrodeposited copper foil of claim 1, wherein the drum side and the deposited side each exhibits a void volume (Vv) value in the range of 0.17 to 1.17 $\mu m^3/\mu m^2$.

3. The electrodeposited copper foil of claim 1, wherein at least one of the drum side and the deposited side further exhibits a core void volume (Vvc) value in the range of 0.16 to 1.07 $\mu m^3/\mu m^2$.

4. The electrodeposited copper foil of claim 1, wherein the drum side and the deposited side each further exhibits a core void volume (Vvc) value in the range of 0.16 to 1.07 $\mu m^3/\mu m^2$.

5. The electrodeposited copper foil of claim 1, wherein at least one of the drum side and the deposited side further exhibits a dale void volume (Vvv) value in the range of 0.01 to 0.10 $\mu m^3/\mu m^2$.

6. The electrodeposited copper foil of claim 1, wherein the drum side and the deposited side each further exhibits a dale void volume (Vvv) value in the range of 0.01 to 0.10 $\mu m^3/\mu m^2$.

7. The electrodeposited copper foil of claim 1, wherein the electrodeposited copper foil further exhibits a fatigue life/thickness of more than 5 $\mu m^{-1}$.

8. The electrodeposited copper foil of claim 7, wherein the fatigue life/thickness is in the range of 8 to 40 $\mu m^{-1}$.

9. The electrodeposited copper foil of claim 1, wherein the electrodeposited copper foil has a thickness in the range of 2 $\mu m$ to 25 $\mu m$.

10. The electrodeposited copper foil of claim 1, wherein a surface of the copper foil comprises at least one coating selected from the group consisting of a zinc-chromium coating, a chromium coating, and an organic coating.

11. The electrodeposited copper foil of claim 1, wherein a surface of the copper foil comprises a chromium plating.

12. A current collector for a lithium-ion secondary battery comprising the electrodeposited copper foil of claim 1.

13. The current collector of claim 12, further comprising an anode active material in contact with the deposited side of the electrodeposited copper foil.

14. The current collector of claim 12, further comprising an anode active material in contact with the drum side of the electrodeposited copper foil.

15. A lithium-ion secondary battery comprising the current collector of claim 12.

16. A device comprising the lithium-ion secondary battery of claim 15.

* * * * *